(12) United States Patent
Shih et al.

(10) Patent No.: US 9,046,781 B2
(45) Date of Patent: Jun. 2, 2015

(54) STRUCTURE AND METHOD FOR REFLECTIVE-TYPE MASK

(71) Applicant: Taiwan Semiconductor Manufacturing Company, Ltd., Hsin-Chu (TW)

(72) Inventors: Chih-Tsung Shih, Hsinchu (TW); Shinn-Sheng Yu, Hsinchu (TW); Jeng-Horng Chen, Hsin-chu (TW); Wei-Hung Liu, Hsinchu (TW); Chia-Chen Chen, Hsinchu (TW); Chi-Lun Lu, Hsinchu (TW); Anthony Yen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 135 days.

(21) Appl. No.: 13/944,080

(22) Filed: Jul. 17, 2013

(65) Prior Publication Data

US 2014/0272678 A1    Sep. 18, 2014

Related U.S. Application Data

(60) Provisional application No. 61/789,750, filed on Mar. 15, 2013.

(51) Int. Cl.
  *G03F 1/22* (2012.01)
  *G03F 1/24* (2012.01)
  *G03F 7/20* (2006.01)

(52) U.S. Cl.
  CPC ... *G03F 1/24* (2013.01); *G03F 7/20* (2013.01)

(58) Field of Classification Search
  CPC .................................. G03F 1/22; G03F 1/24
  USPC ................................ 430/5, 322, 323; 378/35
  See application file for complete search history.

(56) References Cited

U.S. PATENT DOCUMENTS

2014/0011121 A1* 1/2014 Yu et al. ........................... 430/5

* cited by examiner

*Primary Examiner* — Stephen Rosasco
(74) *Attorney, Agent, or Firm* — Haynes and Boone, LLP

(57) ABSTRACT

The present disclosure provides an embodiment of a reflective mask that includes a substrate; a reflective multilayer formed on the substrate; a capping layer formed on the reflective multilayer and having a hardness greater than about 8; and an absorber layer formed on the capping layer and patterned according to an integrated circuit layout.

20 Claims, 7 Drawing Sheets

| | n | k |
|---|---|---|
| SiC | 0.9822 | 0.0048 |
| Ru | 0.8864 | 0.0171 |

FIG. 3

STRUCTURE AND METHOD FOR REFLECTIVE-TYPE MASK

CROSS REFERENCE

This application claims the benefit of U.S. Provisional Application No. 61/789,750 entitled "STRUCTURE AND METHOD FOR REFLECTIVE-TYPE MASK" filed Mar. 15, 2013, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed. In one example associated with lithography patterning, a photo mask to be used in a lithography process has a circuit pattern defined thereon and is to be transferred to wafers. A reflective mask is used during extreme ultraviolet (EUV) lithography process. However, the existing reflective mask is vulnerable to manufacturing fabrication, such as cleaning process, and is easily damaged.

Therefore, what are needed are the reflective mask and the method making the same to address the above issues.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

FIG. 3 is a table providing various data of a feature in the reflective mask of FIG. 1 according to one or more embodiments of the present invention.

DETAILED DESCRIPTION

Figure 1:
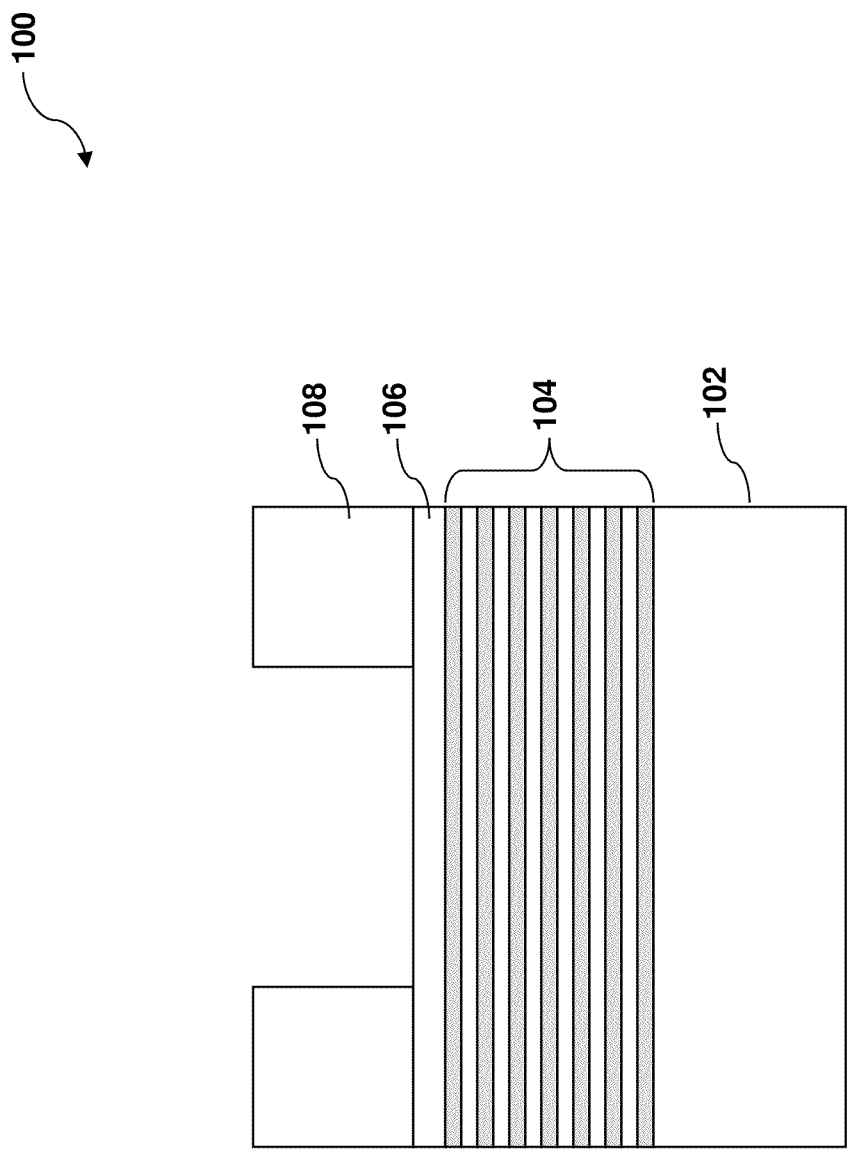
FIG. 1 is a sectional view of a reflective photo mask used in an extreme ultraviolet (EUV) lithography exposing tool constructed according to one or more embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a sectional view of a reflective photo mask (or reflective reticle or reflective mask) 100 used in an extreme ultraviolet (EUV) lithography exposing tool constructed according to one or more embodiment of the present disclosure.

The reflective mask 100 includes a substrate 102. The substrate 102 is chosen to minimize image distortion due to mask heating by the intensified illumination radiation. In the present embodiments, the substrate 102 includes a low thermal expansion material (LTEM). The LTEM may include fused quartz, silicon carbide, silicon oxide-titanium oxide alloy and/or other suitable LTEM known in the art. Alternatively, the substrate 102 includes other materials, such as quartz or glass, depending on design requirements of the mask. The substrate 102 includes materials with a low defect level and a smooth surface.

The reflective mask 100 includes a reflective multilayer (RML) 104 (also referred to as a multilayer mirror (MLM)) deposited on the substrate 102. The RML 104 is designed to reflect of the radiation light directed to the substrate 102. In one embodiment, the RML 104 includes alternating layers of two materials deposited on the top of the substrate 102 to act as a Bragg reflector that maximizes the reflection of the radiation light, such as EUV with 13.5 nm wavelength.

The combination of the two materials in the alternating layers selected to provide a large difference in refractive indices between the two layers (for example, to achieve large reflectivity at an interface of the two layers according to Fresnel equations), yet provide small extinction coefficients for the layers (for example, to minimize absorption). In an example, the RML 104 includes molybdenum-silicon (Mo/Si) layer pairs. In another example, the RML 104 includes molybdenum-beryllium (Mo/Be) layer pairs. A thickness of each layer of each layer pair of the RML 104 is adjusted depending on a wavelength and an angle of incidence of light (such as extreme ultraviolet (EUV) radiation) incident on the mask, such that the mask achieves maximum constructive interference of light reflected from different interfaces of the RML 104. In general, reflectivity of the RML 104 increases as a number of layer pairs of the RML increases. Accordingly, in principle, if the number of layer pairs is sufficiently large and extinction coefficients of the materials of the layers are close to zero, the reflectivity of the RML 104 can approach 100% regardless of the difference of the refractive indices of the materials of the layers in the layer pairs. However, in the EUV wavelength range, the highest reflectivity that can be achieved is limited by the extinction coefficients of the materials employed for the layers of the RML 104. In the present example, the number of layer pairs of the RML 104 is from twenty to eighty. For example, in the depicted embodiment, to achieve more than 90% of the maximum achievable reflectivity (with the chosen materials) of the RML 104 and minimize mask blank manufacturing time and costs, the RML 104 includes about forty layer pairs, such as forty Mo/Si pairs. In furtherance of the example, the Mo/Si pairs includes a silicon layer having a thickness of about 3 nm to 5 nm (for example, about 4 nm); and a molybdenum layer having a thickness of about 2 nm to 4 nm (for example, about 3 nm). Alternatively, the RML 104 includes any other number of layer pairs, depending on reflectivity specifications for the mask. In other alternatives, the RML 104 may include layer groups, in other words, groups of three or more layers having different refractive indices and other characteristics to maximize reflectivity.

In the present example, the RML 104 includes molybdenum-silicon (Mo/Si) film pairs. The RML 104 includes about 40 (Mo/Si) film pairs and each Mo/Si film pair has a collective thickness of about 7 nm.

The capping layer 106 is deposited on the RML 104. Because the capping layer 106 has different etching characteristics from an absorber layer, the capping layer 106 provides a protection to the RML 104, such as an etch stop layer in a subsequent patterning or a repairing process of the absorber layer.

It was observed that that ozonated water (used to make the reflective mask 100 in the subsequent process) damages a capping layer of ruthenium (Ru) and results in a significant EUV reflectivity drop. It was further observed that after Ru oxidation, Ru oxide is easily etched away by an etchant, such as Cl2 or F2 gas.

Instead of using Ru, a high clean durable material (the clean durability higher than that of Ru) is used to form the capping layer 106. In one embodiment, the capping layer 106 has a hardness greater than about 8 in Mohs scale to achieve good cleaning durability. The capping layer 106 may achieve a good cleaning durability when its hardness is greater than about 8 because it can resist the cleaning chemical. In one embodiment, the high clean durable material for the capping layer 106 is silicon carbide (SiC), which has a hardness between 9 and 9.5. As a comparison, ruthenium has a hardness between 6 and 7.

The high clean durable material is further required to have a high refractive index (approaching to 1) and a low extinction coefficient (substantially zero). The refractive index and extinction coefficient are defined relative EUV light (such as 13.5 nm) used in the EUV lithography process. In one embodiment, the refractive index is greater than the refractive index of Ru and the extinction coefficient is less than the extinction coefficient of Ru. In another embodiment, the refractive index is greater than about 0.9 and the extinction coefficient is less than 0.01. In yet another embodiment, the refractive index is greater than about 0.95 and the extinction coefficient is less than 0.005.

In one embodiment, a SiC film is formed as the capping layer 106. In another embodiment, a Ru alloy film is formed as the capping layer 106. In furtherance of the embodiment, the capping layer 106 includes a Ru alloy selected from the group consisting of YRu, ZrRu, CrRu, RuCo, RuNi, HfRu, RuGe, and combination thereof. In another embodiment, an yttrium (Y) film is formed as the capping layer 106. In yet another embodiment, the capping layer 106 includes one of the above materials or a combination thereof according to various embodiments. In one example, the capping layer 106 is deposited by physical vapor deposition (PVD), chemical vapor deposition (CVD) or other suitable technique.

Figure 2:
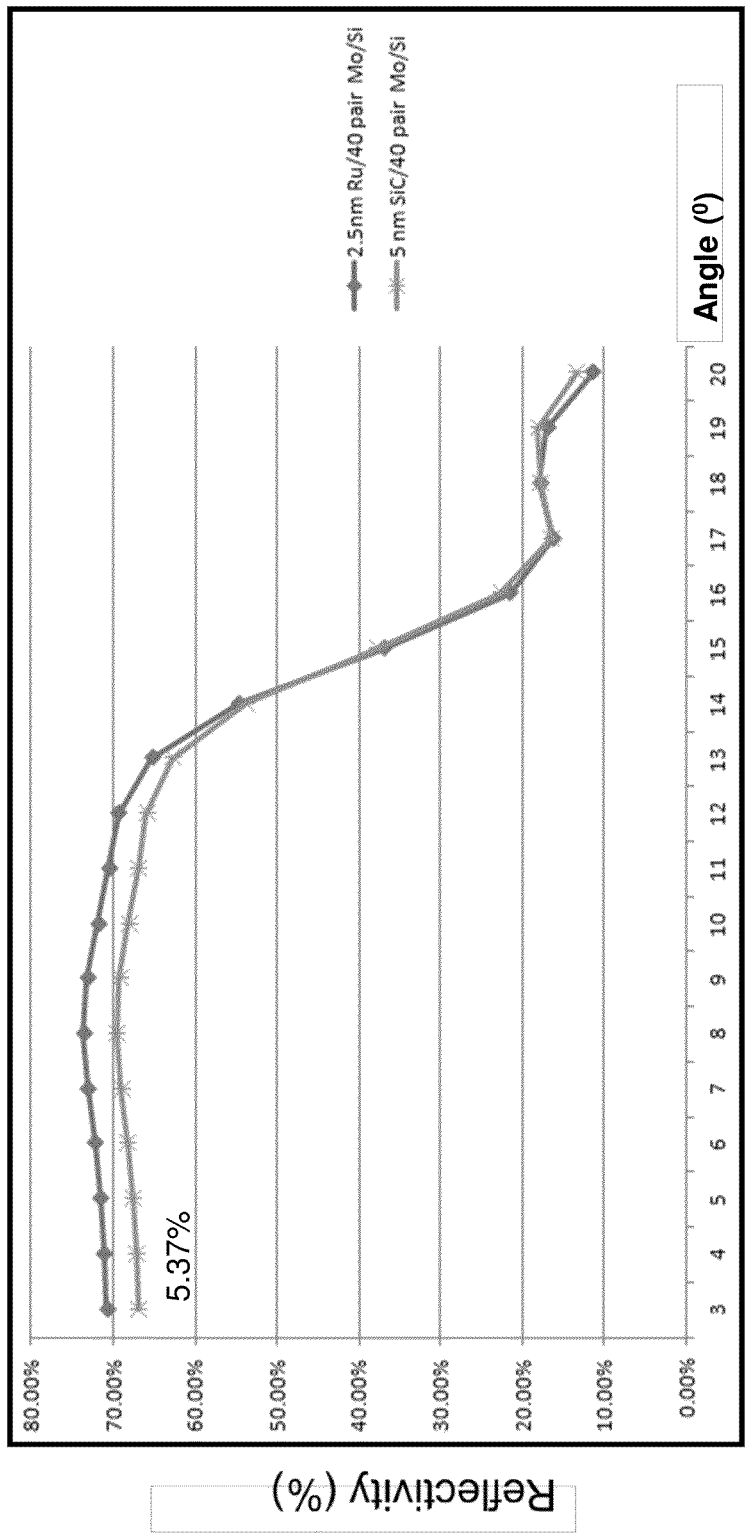
FIG. 2 is a diagram illustrating a characteristic data of a feature in the reflective mask of FIG. 1 according to one or more embodiments of the present invention.
Figure 3:
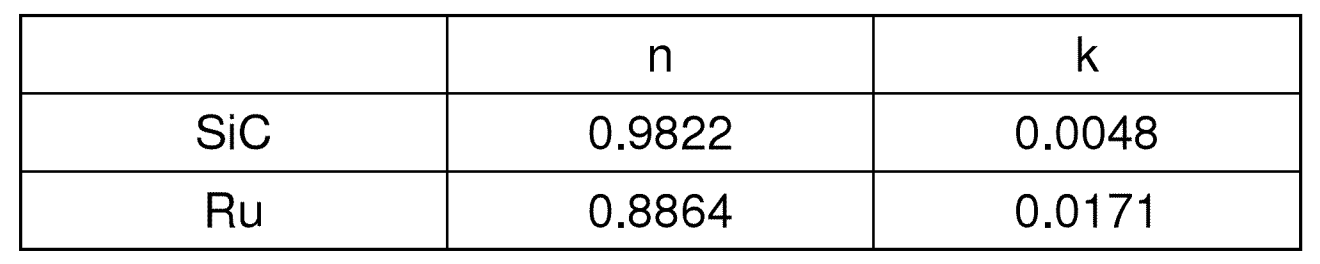

The characteristics of those materials for the capping layer 106 during etching and cleaning are analyzed through various experiments. Taking SiC for an example, SiC has an extreme chemical stability and durability. There is no a simple wet-chemical etchant available for SiC etching. The reflectivity of SiC vs. incident angle is further studied in comparison to Ru, as shown in FIG. 2. The refractive index n and extinction coefficient k of SiC are further studied in comparison to Ru, as shown in FIG. 3. Particularly, the refractive index n of SiC is 0.9822, which is greater than the refractive index of Ru (0.8864) and is greater than 0.95. The extinction coefficient k of SiC is 0.0048, which is less than the extinction coefficient of Ru (0.0171) and is less than 0.005.

The method to clean the reflective mask 100 with the capping layer 106 of SiC is properly chosen for effective cleaning without damaging various features of the reflective mask 100. In one embodiment, a hydrofluoric (HF) acid may be used to clean the reflective mask 100 when other features of the reflective mask 100 are compatible with the cleaning solution. For example, the substrate 102 does not include silicon oxide or alternatively the substrate 102 includes silicon oxide that is not exposed to the cleaning chemical (such as embedded in or covered by other substrate material).

The reflective mask 100 includes an absorber layer 108 formed on the capping layer 106. The absorber layer 108 is deposited on the capping layer 106 and is further patterned to define an IC pattern thereon, such as according to an IC design layout. The absorber layer 108 is designed to absorb radiation light (such as EUV light) during a lithography exposing process. The radiation light passes through the openings of the absorber layer 108 and is reflected by the RML 104, thus the IC pattern is imaged to an IC substrate, such as a silicon wafer. In the present embodiment, the absorber layer 108 includes tantalum boron nitride (TaBN). In another embodiment, the absorber layer 108 includes chromium (Cr), chromium oxide (CrO), titanium nitride (TiN), tantalum nitride (TaN), tantalum (Ta), titanium (Ti), or aluminum-copper (Al—Cu), palladium, tantalum boron nitride (TaBN), aluminum oxide (AlO), molybdenum (Mo), and other suitable materials. In yet another embodiment, the absorber layer 108 includes multiple layers. In one example, the absorber layer 108 is deposited by a deposition technique, such as chemical vapor deposition (CVD), and is patterned by a suitable procedure, such as electron-beam lithography process and etching.

Figure 4:
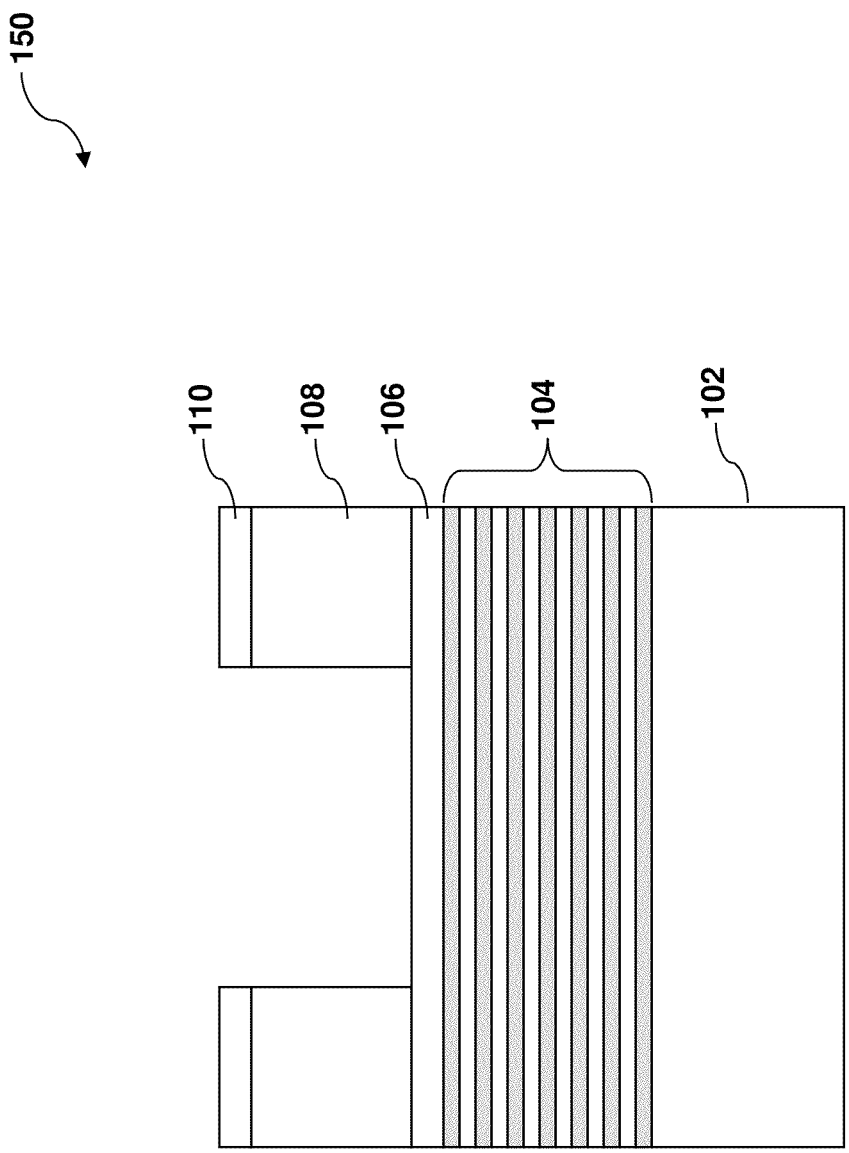
FIG. 4 is a sectional view of a reflective photo mask used in a EUV lithography exposing tool constructed according to another embodiment of the present disclosure.

FIG. 4 is a sectional view of a reflective mask 150 constructed according to another embodiment. The reflective mask 150 includes a substrate 102, a RML 104, a capping layer 106 and an absorber layer 108. These material layers are similar to those in the reflective mask 100 in terms of composition, configuration and formation. Additionally, the reflective mask 150 further includes a protection layer 110 disposed on the absorber layer 108. In some embodiments, the protection layer 110 may protect the absorber layer 108 from an oxidation of the high absorbing material when the mask is in cleaning process. Furthermore, some of the absorber layer 108 has poor clean resistance and the protection layer 110 can enhance the cleaning durability.

The protection layer 110 is chosen to provide effective protection to the absorber layer 108, such as protection from oxidation, etching or damaging during subsequent processes that include etching and cleaning. In one embodiment, the protection layer 110 includes a high clean durable material (the clean durability higher than that of Ru) that is used to form the capping layer 106. The high clean durable material further has a high refractive index and a low extinction coefficient. In one embodiment, the refractive index is greater than the refractive index of Ru and the extinction coefficient is less than the extinction coefficient of Ru. In another embodiment, the refractive index is greater than about 0.9 and the extinction coefficient is less than 0.01. In yet another embodiment, the refractive index is greater than about 0.95 and the extinction coefficient is less than 0.005.

In one embodiment, a SiC film is formed as the protection layer 110. In another embodiment, a Ru alloy film is formed as the protection layer 110. In furtherance of the embodiment, the protection layer 110 includes a Ru alloy selected from the group consisting of YRu, ZrRu, CrRu, RuCo, RuNi, HfRu, RuGe, and combination thereof. In another embodiment, an yttrium (Y) film is formed as the protection layer 110. In yet another embodiment, the protection layer 110 includes one of the above materials or a combination thereof, according to various embodiments. In one example, a same high clean durable material is used to form both the capping layer 106 and the protection layer 110.

The protection layer 110 is patterned such that to be disposed only on the patterned absorber layer 108. In one embodiment to form the reflective mask 150, the absorber layer 108 is deposited and the protection layer 110 is deposited on the absorber layer 108, then a patterning procedure including lithography process and etching is applied to pattern both the absorber layer 108 and the protection layer 110. The etching may include one etch step, such as a dry etching, or two etch steps, such as two wet etch steps, to sequentially pattern the absorber layer 108 and the protection layer 110.

Figure 5:
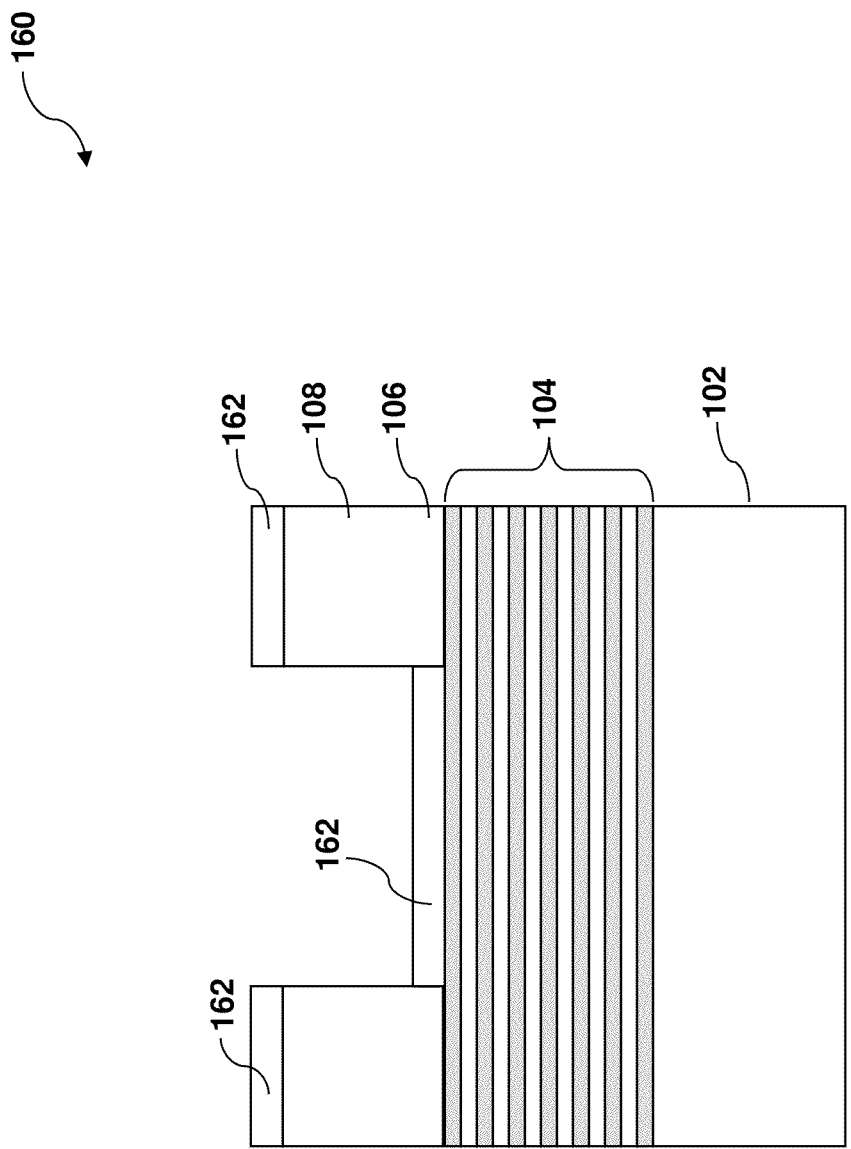
FIG. 5 is a sectional view of a reflective photo mask used in a EUV lithography exposing tool constructed according to another embodiment of the present disclosure.

FIG. 5 is a sectional view of a reflective mask 160 constructed according to another embodiment. The reflective mask 160 includes a substrate 102, a RML 104, and an absorber layer 108. These material layers are similar to those in the reflective mask 100 in terms of composition and formation. The reflective mask 160 further includes a protection layer 162 disposed on the absorber layer 108 and the RML 104, thus providing protection to both the RML 104 and the absorber layer 108 from various processing damages, such as oxidation or etch loss. The absorber layer 108 is deposited on the RML 104 and is further patterned to define an IC pattern. The protection layer 162 is deposited on the absorber layer 108 and the RML 104 within the openings of the absorber layer 104. The protection layer 162 may be additionally deposited on the sidewalls of the absorber layer 108.

In one embodiment, the protection layer 162 includes a high clean durable material (the clean durability higher than that of Ru) that is used to form the capping layer 106 or the protection layer 110. The high clean durable material further has a high refractive index and a low extinction coefficient. In one embodiment, the refractive index is greater than the refractive index of Ru and the extinction coefficient is less than the extinction coefficient of Ru. In another embodiment, the refractive index is greater than about 0.9 and the extinction coefficient is less than 0.01. In yet another embodiment, the refractive index is greater than about 0.95 and the extinction coefficient is less than 0.005.

In one embodiment, a SiC film is formed as the protection layer 162. In another embodiment, a Ru alloy film is formed as the protection layer 162. In furtherance of the embodiment, the protection layer 162 includes a Ru alloy selected from the group consisting of YRu, ZrRu, CrRu, RuCo, RuNi, HfRu, RuGe, and combination thereof. In another embodiment, an yttrium (Y) film is formed as the protection layer 162. In yet another embodiment, the protection layer 162 includes one of the above materials or a combination thereof, according to various embodiments.

Figure 6:
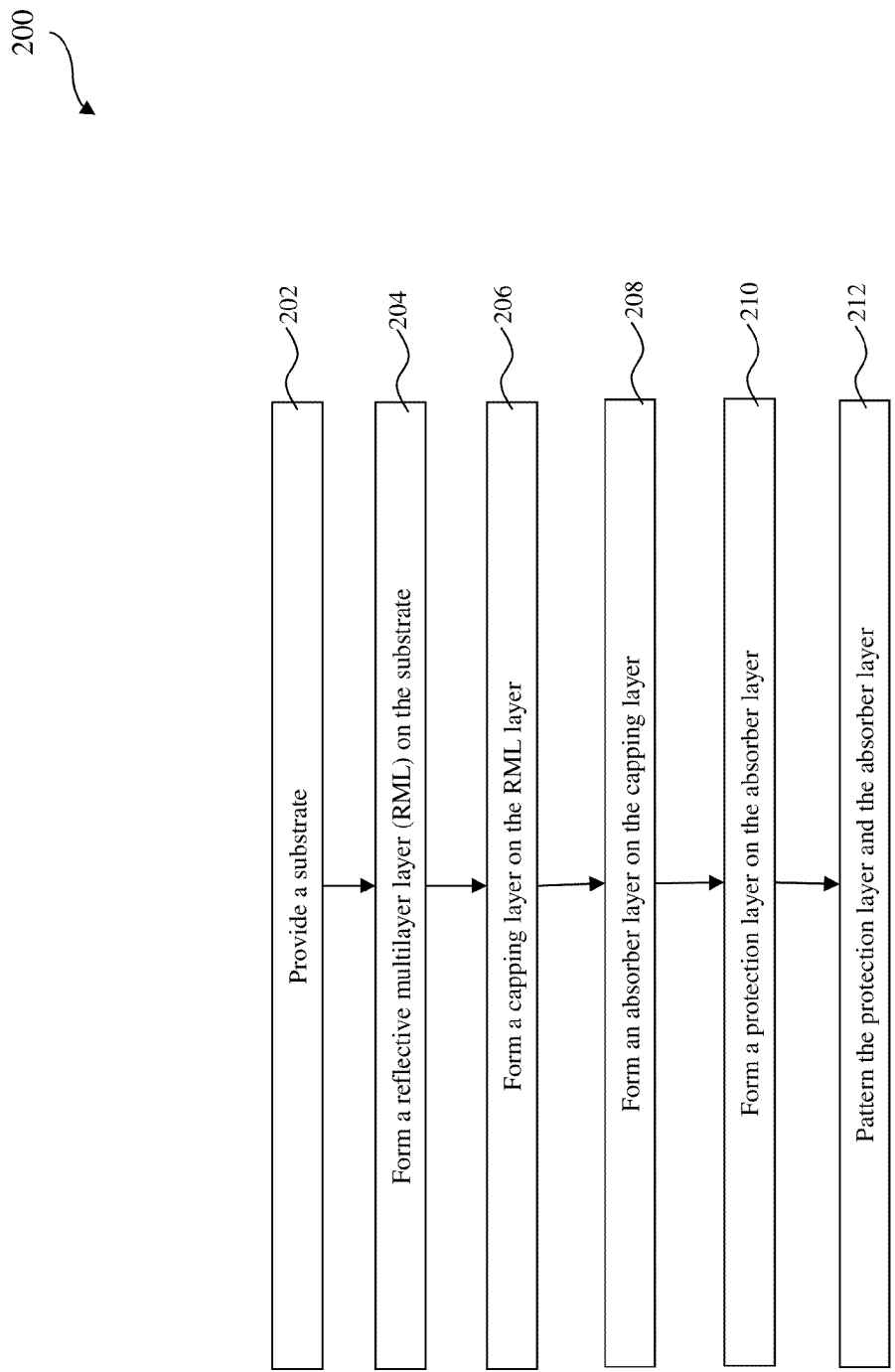
FIG. 6 is a flowchart of a method making a reflective photo mask used in a EUV lithography exposing tool constructed according to various embodiments of the present disclosure.

FIG. 6 is a flowchart of a method 200 to form a reflective mask 150 according to some embodiments. The method 200 is described with reference to FIGS. 4 and 6. The method 200 begins at 202 by providing a substrate 102. The substrate 102 is chosen to minimize image distortion due to mask heating by the intensified illumination radiation. In the present embodiments, the substrate 102 includes a LTEM. The LTEM may include fused quartz, silicon carbide, silicon oxide-titanium oxide alloy and/or other suitable LTEM known in the art. Alternatively, the substrate 102 includes other materials, such as quartz or glass, depending on design requirements of the mask.

The method 200 proceeds to operation 204 by forming a RML layer 104 on the substrate 102. In one embodiment, the RML 104 includes alternating layers of two materials deposited on the top of the substrate 102 to act as a Bragg reflector that maximizes the reflection of the radiation light, such as EUV with 13.5 nm wavelength. The combination of the two materials in the alternating layers selected to provide a large difference in refractive indices between the two layers and further to provide small extinction coefficients or minimized absorption. In an example, the RML 104 includes molybdenum-silicon (Mo/Si) layer pairs. In another example, the RML 104 includes molybdenum-beryllium (Mo/Be) layer pairs. The RML 104 is formed by PVD or other suitable technique. For example, Mo and Be are alternatively deposited to form the RML 104 using PVD or other suitable deposition technique. In furtherance of the example, the substrate 102 is deposited with a Mo layer using a Mo target by sputtering and is deposited with a Si layer using a Si target by sputtering. This processing cycle is repeated until a number of the Mo/Si layer pairs are formed. In one example, the number of layer pairs of the RML 104 ranges from 20 to 80. In another example, the Mo/Si pairs includes a silicon layer having a thickness of about 3 nm to 5 nm and a molybdenum layer having a thickness of about 2 nm to 4 nm.

The method 200 proceeds to operation 206 by forming a capping layer 106 on the RML layer 104. The capping layer 106 is formed by PVD or other suitable technique. The capping layer 106 includes a high clean durable material with a clean durability higher than that of Ru. The high clean durable material further has a high refractive index and a low extinction coefficient. In one embodiment, the refractive index is greater than the refractive index of Ru and the extinction coefficient is less than the extinction coefficient of Ru. In another embodiment, the refractive index is greater than about 0.9 and the extinction coefficient is less than 0.01. In yet another embodiment, the refractive index is greater than about 0.95 and the extinction coefficient is less than 0.005.

In one embodiment, the capping layer 106 is a SiC film. In another embodiment, a Ru alloy film is formed as the capping layer 106. In furtherance of the embodiment, the capping layer 106 includes a Ru alloy selected from the group consisting of YRu, ZrRu, CrRu, RuCo, RuNi, HfRu, RuGe, and combination thereof. In another embodiment, the capping layer 106 includes an yttrium (Y) film. In yet another embodiment, the capping layer 106 includes one of the above materials or a combination thereof, according to various embodiments.

The method 200 proceeds to operation 208 by forming an absorber layer 108 on the capping layer 106. In the present embodiment, the absorber layer 108 includes tantalum boron nitride (TaBN). In another embodiment, the absorber layer 108 includes chromium (Cr), chromium oxide (CrO), titanium nitride (TiN), tantalum nitride (TaN), tantalum (Ta), titanium (Ti), or aluminum-copper (Al—Cu), palladium, tantalum boron nitride (TaBN), aluminum oxide (AlO), molybdenum (Mo), and other suitable materials. In yet another embodiment, the absorber layer 108 includes multiple layers.

In one example, the absorber layer 108 is deposited by a deposition technique, such as CVD, PVD or other suitable technique.

The method 200 proceeds to operation 210 by forming a protection layer 110 on the absorber layer 108. The protection layer 110 also includes a high clean durable material with a clean durability higher than that of Ru and is similar to the capping layer 106 in terms of composition and formation. In one example, a same high clean durable material is used to form both the capping layer 106 and the protection layer 110.

The method 200 proceeds to operation 212 by patterning the protection layer 110 and the absorber layer 108. In one embodiment, the operation 212 includes a lithography process and an etching process. The lithography process includes coating the mask 150 by a resist layer, applying a radiation beam (such as an electron-beam) to expose the resist layer and develop the resist layer to form a patterned resist layer. The lithography process may further include other steps, such as soft baking, post-exposure-baking or hard baking. The etching process may include one or more etch steps. In one example, the etching process includes one dry etch to etch both the protection layer 110 and the absorber layer 108. In another example, the etching process includes two etch steps each having etchant selectively etch the respective material layer (such as the protection layer 110 or the absorber layer 108).

In another embodiment, when the method 200 is used to form the reflective mask 100 where the protection layer 110 is eliminated, the method 200 skips the operation 210. Furthermore, the operation 212 is designed to only pattern the absorber layer 108.

In yet another embodiment, when the method 200 is used to form the reflective mask 160 where the protection layer 162 is formed on both the RML 104 and the absorber layer 108, the method 200 skips the operation 206 and the operation 212 is designed to only pattern the absorber layer 108. Furthermore, the operation 210 is implemented after the operation 212, thus forming the protection layer 162 on both the absorber layer 108 and the RML 104.

Figure 7:
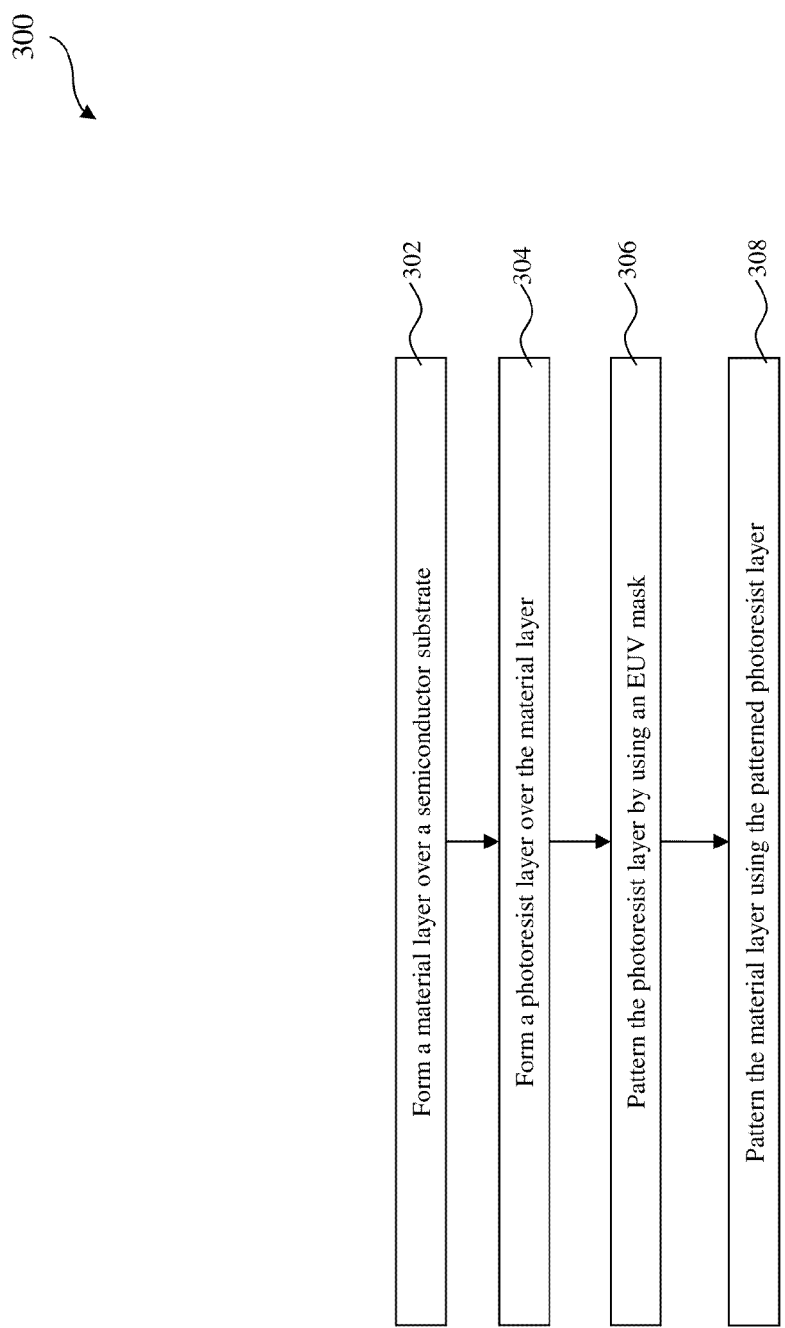
FIG. 7 is a flowchart of a method making an integrated circuit constructed according to various embodiments of the present disclosure.

FIG. 7 is a flowchart of a method 300 making an integrated circuit according to some embodiments. The method 300 is described with reference to FIGS. 1, 4, 5 and 7. The method 300 starts with a semiconductor substrate or other suitable substrate to be patterned to form an integrated circuit thereon. In the present embodiment, the semiconductor substrate includes silicon. Alternatively or additionally, the semiconductor substrate includes germanium, silicon germanium or other suitable semiconductor material, such as diamond, silicon carbide or gallium arsenic. The semiconductor substrate may further include additional features and/or material layers, such as various isolation features formed in the substrate. The semiconductor substrate may include various p-type doped regions and/or n-type doped regions configured and coupled to form various devices and functional features. All doping features may be achieved using a suitable process, such as ion implantation in various steps and techniques. The semiconductor substrate may include other features, such as shallow trench isolation (STI) features. The semiconductor substrate may also include a portion of an interconnect structure that includes metal lines in various metal layers, via features to provide vertical connection between the metal lines in the adjacent metal layers, and contact features to provide vertical connection between the metal lines in the first metal layer and various device features (such as gates, sources and drains) on the substrate.

The method 300 includes an operation 302 to form a material layer over the semiconductor substrate (or other suitable substrate). As one embodiment for illustration, the material layer includes a dielectric material, such as an interlayer dielectric (ILD) to form conductive features (e.g., metal lines, vias or contacts) therein. The ILD layer may include silicon oxide, low dielectric material (with a dielectric constant less than that of the thermal silicon oxide). The ILD layer may include more than one or more dielectric films. The ILD layer may be deposited on the semiconductor substrate by chemical vapor deposition (CVD), spin-on coating or other suitable technique. The material layer may alternatively include other material to be patterned. For example, the material layer may include a conductive material, such as doped polysilicon, metal or metal alloy, to be patterned to form gate electrodes for the field effect transistors in the integrated circuit.

The method 300 proceeds to an operation 304 by forming a photoresist layer over the material layer. The photoresist layer is sensitive to the radiation from the exposing source during a subsequent photolithography exposing process. In the present embodiment, the photoresist layer is sensitive to EUV light used in the photolithography exposing process. The photoresist layer may be formed over the material layer by spin-on coating or other suitable technique. The coated photoresist layer may be further baked to drive out solvent in the photoresist layer.

The method 300 proceeds to an operation 306 by patterning the photoresist layer using an EUV mask. In one embodiment, the EUV mask is the photomask 100 described in FIG. 1. The photomask 100 includes a capping layer 106 formed over the RML layer 104. The capping layer 106 includes a high clean durable material. In one example, the capping layer 106 has a hardness greater than about 8 in Mohs scale to achieve good cleaning durability. In another example, the high clean durable material is further required to have a high refractive index (such as greater than 0.9) and a low extinction coefficient (such as less than 0.01). In one example, the capping layer 106 includes silicon carbide. In other examples, the capping layer may include yttrium, or ruthenium alloy (such as YRu, ZrRu, CrRu, RuCo, RuNi, HfRu or RuGe). Alternatively, the EUV mask is the photomask 150 in FIG. 4 or the photomask 160 in FIG. 5.

The patterning of the photoresist layer includes performing a photolithography exposing process by an EUV exposing system using the EUV mask. During the exposing process, the IC design pattern defined on the EUV mask is imaged to the photoresist layer to form a latent patent thereon. The patterning of the photoresist layer further includes developing the exposed photoresist layer to form a patterned photoresist layer having one or more openings. In one embodiment where the photoresist layer is a positive tone photoresist layer, the exposed portions of the photoresist layer are removed during the developing process. The patterning of the photoresist layer may further include other process steps, such as various baking steps at different stages. For example, a post-exposure-baking (PEB) process may be implemented after the photolithography exposing process and before the developing process.

The method 300 proceeds to an operation 308 by patterning the material layer utilizing the patterned photoresist layer. In one embodiment, the patterning the material layer includes applying an etching process to the material layer using the patterned photoresist layer as an etch mask. The portions of the material layer exposed within the openings of the patterned photoresist layer are etched while the rest portions are protected from etching. In the present embodiment, the operation 308 forms various trenches in the ILD layer.

The method 300 may include other processing steps. For example, the patterned photoresist layer may be removed by wet stripping or plasma ashing after the operation 308. In another example, one or more conductive materials are filled (such as by deposition and polishing) in the trenches of the ILD layer to form corresponding conductive features (such as metal lines) for electrical routing.

In alternative embodiment, the method 300 may include the operations 304, 306 and 308 to form doped features in the semiconductor substrate. In this case, the patterned photoresist layer formed by the operations 304 and 306 is used as an ion implantation mask and the operation 308 includes performing an ion implantation process to the semiconductor substrate. The ion implantation process introduces dopant species to the semiconductor substrate through the openings of the patterned photoresist layer.

Thus, the present disclosure provides an embodiment of a reflective mask that includes a substrate; a reflective multilayer formed on the substrate; a capping layer formed on the reflective multilayer and having a cleaning durability higher than that ruthenium; and an absorber layer formed on the capping layer and patterned according an integrated circuit layout.

In one embodiment of the reflective mask, the capping layer has a refractive index greater than about 0.95 and an extinction coefficient less than 0.005. In another embodiment, the capping layer includes silicon carbide. In yet another embodiment, the capping layer includes a Ru alloy selected from the group consisting of YRu, ZrRu, CrRu, RuCo, RuNi, HfRu, RuGe, and combination thereof. In yet another embodiment, the capping layer includes an yttrium (Y) layer.

According to one embodiment, the substrate includes a low thermal expansion material (LTEM). The substrate may include a material selected from the group consisting of fused silica, titanium oxide (TiO$_2$) doped fused silica (SiO$_2$), fused quartz, calcium fluoride (CaF$_2$), and a combination thereof.

In another embodiment, the reflective multilayer includes a plurality of alternating molybdenum-silicon (Mo/Si) films. Alternatively, the reflective multilayer includes a plurality of alternating molybdenum-beryllium (Mo/Be) films.

In yet another embodiment, the absorber layer includes tantalum boron nitride (TaBN). Alternatively, the absorber layer may include a material selected from the group consisting of chromium (Cr), chromium oxide (CrO), titanium nitride (TiN), tantalum nitride (TaN), tantalum (Ta), titanium (Ti), or aluminum-copper (Al—Cu), palladium, tantalum boron nitride (TaBN), aluminum oxide (AlO), molybdenum (Mo).

In yet another embodiment, the reflective mask further includes a protective layer formed on the absorber layer, wherein the protective layer and the capping layer include a same material.

The present disclosure also provides another embodiment of a reflective mask. The reflective mask includes a substrate; a reflective multilayer formed on the substrate; a capping layer of a material formed on the reflective multilayer; an absorber layer formed on the capping layer; and a protective layer of the material formed on the absorber layer, wherein the absorber layer and the protective layer are both patterned according to an integrated circuit layout.

In one embodiment, the material has a cleaning durability greater than that of ruthenium (Ru); a refractive index greater than about 0.95; and an extinction coefficient less than 0.005. In another embodiment, the material includes a Ru alloy selected from the group consisting of YRu, ZrRu, CrRu, RuCo, RuNi, HfRu, RuGe, and combination thereof. In yet another embodiment, the material includes one of silicon carbide and yttrium (Y).

In another embodiment, the substrate includes a low thermal expansion material (LTEM); the reflective multilayer includes a plurality of alternating molybdenum-silicon (Mo/Si) films; and the absorber layer includes tantalum boron nitride (TaBN).

The present disclosure also provides one embodiment of a method making a reflective mask. The method includes forming a reflective multilayer formed on a substrate; forming a capping layer of a material on the reflective multilayer; forming an absorber layer on the capping layer; forming a protective layer of the material on the absorber layer; and patterning both the absorber layer and the protective layer based on an integrated circuit layout.

In one embodiment, the material includes one of silicon carbide, yttrium (Y), YRu, ZrRu, CrRu, RuCo, RuNi, HfRu, and RuGe. In another embodiment, at least one of the forming the capping layer and the forming the protective layer includes depositing the material by physical vapor deposition (PVD); the patterning both the absorber layer and the protective layer includes applying an electron-beam to pattern both the absorber layer and the protective layer.

The present disclosure also provides one embodiment of a method for forming an integrated circuit. The method includes forming a material layer over a substrate; forming a photoresist layer over the material layer; and patterning the photoresist layer using a photomask in a photolithography process. The photomask includes a substrate; a reflective multilayer over the substrate; a capping layer over the reflective multilayer and having a hardness greater than about 8; and an absorber layer formed on the capping layer and patterned according to an integrated circuit layout.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A reflective mask, comprising:
   a substrate;
   a reflective multilayer formed on the substrate;
   a capping layer formed on the reflective multilayer and having a hardness greater than about 8; and
   an absorber layer formed on the capping layer and patterned according to an integrated circuit layout.

2. The reflective mask of claim 1, wherein the capping layer has a refractive index greater than about 0.95 and an extinction coefficient less than 0.005.

3. The reflective mask of claim 1, wherein the capping layer includes silicon carbide.

4. The reflective mask of claim 1, wherein the capping layer includes a Ru alloy selected from the group consisting of YRu, ZrRu, CrRu, RuCo, RuNi, HfRu, RuGe, and combination thereof.

5. The reflective mask of claim 1, wherein the capping layer includes an yttrium (Y) layer.

6. The reflective mask of claim 1, wherein the substrate includes a low thermal expansion material (LTEM).

7. The reflective mask of claim 1, wherein the substrate includes one material selected from the group consisting of fused silica, titanium oxide (TiO$_2$) doped fused silica (SiO$_2$), fused quartz, calcium fluoride (CaF$_2$), and a combination thereof.

8. The reflective mask of claim 1, wherein the reflective multilayer includes a plurality of alternating molybdenum-silicon (Mo/Si) films.

9. The reflective mask of claim 1, wherein the reflective multilayer includes a plurality of alternating molybdenum-beryllium (Mo/Be) films.

10. The reflective mask of claim 1, wherein the absorber layer includes tantalum boron nitride (TaBN).

11. The reflective mask of claim 1, wherein the absorber layer includes a material selected from the group consisting of chromium (Cr), chromium oxide (CrO), titanium nitride (TiN), tantalum nitride (TaN), tantalum (Ta), titanium (Ti), or aluminum-copper (Al—Cu), palladium, tantalum boron nitride (TaBN), aluminum oxide (AlO), molybdenum (Mo).

12. The reflective mask of claim 1, further comprising a protective layer formed on the absorber layer, wherein the protective layer and the capping layer include a same material.

13. A reflective mask, comprising:
a substrate;
a reflective multilayer formed on the substrate;
a capping layer of a material formed on the reflective multilayer;
an absorber layer formed on the capping layer; and
a protective layer of the material formed on the absorber layer, wherein the absorber layer and the protective layer are both patterned according to an integrated circuit layout.

14. The reflective mask of claim 13, wherein the material has
a cleaning durability greater than that of ruthenium (Ru);
a refractive index greater than about 0.95; and
an extinction coefficient less than 0.005.

15. The reflective mask of claim 13, wherein the material includes a Ru alloy selected from the group consisting of YRu, ZrRu, CrRu, RuCo, RuNi, HfRu, RuGe, and combination thereof.

16. The reflective mask of claim 13, wherein the material includes one of silicon carbide and yttrium (Y).

17. The reflective mask of claim 13, wherein
the substrate includes a low thermal expansion material (LTEM);
the reflective multilayer includes a plurality of alternating molybdenum-silicon (Mo/Si) films; and
the absorber layer includes tantalum boron nitride (TaBN).

18. A method for forming an integrated circuit comprising:
forming a material layer over a substrate;
forming a photoresist layer over the material layer; and
patterning the photoresist layer using a photomask in a photolithography process, wherein the photomask includes
a substrate;
a reflective multilayer over the substrate;
a capping layer over the reflective multilayer and having a hardness greater than about 8; and
an absorber layer formed on the capping layer and patterned according to an integrated circuit layout.

19. The method of claim 18, wherein the capping layer includes one of silicon carbide, yttrium (Y), YRu, ZrRu, CrRu, RuCo, RuNi, HfRu, and RuGe.

20. The method of claim 18, wherein
the forming the photoresist layer includes coating a material layer sensitive to an extreme ultraviolet (EUV) radiation; and
the patterning the photoresist layer includes performing a photolithography exposing process to the photoresist layer by an EUV photolithography system using the photomask and thereafter developing the photoresist layer to form a patterned photoresist layer.

* * * * *